United States Patent
Tomoyasu

[11] Patent Number: 5,904,780
[45] Date of Patent: May 18, 1999

[54] PLASMA PROCESSING APPARATUS

[75] Inventor: Masayuki Tomoyasu, Nirasaki, Japan

[73] Assignee: Tokyo Electron Limited, Tokyo, Japan

[21] Appl. No.: 08/847,178

[22] Filed: May 1, 1997

[30] Foreign Application Priority Data

May 2, 1996 [JP] Japan .................................... 8-135943

[51] Int. Cl.$^6$ ................................................. C23C 16/00
[52] U.S. Cl. ............................... 118/723 AN; 118/723 R; 156/345
[58] Field of Search ............................ 118/723 R, 723 E, 118/723 ER, 723 I, 723 IR, 723 AN, 723 MR, 723 MA; 156/345; 204/298.37, 298.16; 315/111.41, 111.51

[56] References Cited

U.S. PATENT DOCUMENTS

| | | | |
|---|---|---|---|
| 5,061,838 | 10/1991 | Lane et al. | 219/121.59 |
| 5,113,790 | 5/1992 | Geisler et al. | 118/723 |
| 5,527,394 | 6/1996 | Heinrich et al. | 118/723 E |
| 5,556,501 | 9/1996 | Collins et al. | 156/345 |
| 5,591,493 | 1/1997 | Paranjpe et al. | 427/569 |
| 5,683,548 | 11/1997 | Hartig et al. | 156/643.1 |

FOREIGN PATENT DOCUMENTS

| | | |
|---|---|---|
| 0 403 418 | 12/1990 | European Pat. Off. . |
| 0 607 797 | 7/1994 | European Pat. Off. . |
| 0 678 903 | 10/1995 | European Pat. Off. . |

*Primary Examiner*—R. Bruce Breneman
*Assistant Examiner*—Luz L. Alejandro
*Attorney, Agent, or Firm*—Oblon, Spivak, McClelland, Maier & Neustadt, P.C.

[57] ABSTRACT

In a plasma etching apparatus, an inactive gas and a reactive gas are supplied from gas spouting holes into a process chamber, and are turned into plasma by means of RF discharge, so that a semiconductor wafer placed on a susceptor is etched by the plasma. An antenna formed of a solenoidal coil is arranged around the side wall of the process chamber, so as to generate an RF inductive electric field in the process chamber. A plurality of barriers are arranged to extend into the skin-depth region of the plasma from the side wall of the process chamber, so as to limit a mean free path of electrons in the skin-depth region. The barriers decrease density of low energy electrons in the skin depth region, so as to suppress progress of dissociation of the reactive gas, thereby obtaining a predetermined etching selectivity.

18 Claims, 8 Drawing Sheets

PLASMA PROCESSING APPARATUS

BACKGROUND OF THE INVENTION

The present invention relates to an apparatus for subjecting a target object, such as a semiconductor wafer or LCD substrate, to a process, such as etching or deposition, using plasma generated by means of radio frequency (RF) discharge, and in particular to an apparatus which is capable of performing a stable process while suppressing excessive dissociation of a process gas.

In processes of manufacturing semiconductors, various kinds of plasma processes, such as etching, are performed on a target object, such as a semiconductor wafer, in a plasma atmosphere, while plasma is generated in a process chamber. In recent years, as patterns given to the target object have been increasingly miniaturized, demands have come for a plasma process to be performed with a higher accuracy under a design rule of sub-quarter micron.

Along with the demand for miniaturizing semiconductor devices at a high degree in a horizontal direction, it has become necessary for the devices to have a three-dimensional shape. For example, the structure of capacitor devices expands in vertical directions to obtain an electrostatic capacitance of a certain level, while the structure of wirings increases its vertical size to decrease wiring resistance. For this reason, portions to be etched in their manufacturing process becomes deeper, so that a ratio of the depth of the to-be-etched portions relative to the thickness of a photoresist grows higher. In such a case, etching selectivity of a material of the to-be-etched portions relative to the photoresist needs to be high in order to avoid a dimensional shift due to retreat of the photoresist.

Taking account of this demand, plasma sources for generating a high density plasma have been developed. In recent years, it has been attempted to etch, for example, an oxide film on a semiconductor wafer at a high selectivity, using a high density plasma generated by a system of, e.g., the helicon wave type, ECR (Electron Cyclotron Resonance) type, TCP (transformer Coupled Plasma) type, or the ICP (Inductively Coupled Plasma) type.

A photoresist used with I lines in the ultraviolet domain has a good etching selectivity of about 7 to 8 for $SiO_2$ relative to the resist, in plasma of an ordinary density, such as about $1 \times 10^{11}$ /cm$^3$. However, in a high density plasma generated by, e.g., the ICP type, the etching selectivity is decreased down to a value of 3 to 4. The photoresist, thus does not have a sufficient durability relative to a high density plasma.

On the basis of the demand for high miniaturization, it has also been proposed to expose a photoresist to ultraviolet radiation, such as Kr excimer laser, having a wavelength shorter than that of the I lines. As compared to the photoresist used with the I lines, the photoresist used with the excimer laser has a lower durability against plasma, in order to suppress the polymerized degree of polymers in accordance with a shorter wavelength. As a result, the latter photoresist presents a lower etching selectivity of $SiO_2$ to this photoresist.

Further, in a high density plasma generated by the TCP type, an equilibrium state is gradually settled by repeating a cycle in which radicals produced by dissociation are deposited on the inner wall of a process chamber and the deposited radicals are returned into plasma. With this high density plasma, as an etching process is repeated, the deposition on the inner wall grows thicker than that at the beginning, and the radical composition in the plasma is changed. The change of the radical composition brings about a difficulty in obtaining a good reproductivity of etching properties. For this reason, a countermeasure of, e.g., heating the inner wall of the process chamber is carried out in order to form a stable state on the surface of the inner wall, but it is hardly controlled to form the stable state.

BRIEF SUMMARY OF THE INVENTION

The present invention has been made in light of the above described problems, and one of its objects is to provide a plasma processing apparatus of the inductively coupled type, such as the TCP or ICP type, which is capable of efficiently performing a stable process.

Another one of the objects of the present invention is to provide a plasma etching apparatus of the inductively coupled type, which is capable of performing a stable etching process at a high etching selectivity.

According to a first aspect of the present invention, there is provided a plasma processing apparatus for subjecting a target object to a process, using plasma, comprising:

an airtight process chamber;

a work table arranged in the process chamber for supporting the target object;

an exhaust for exhausting and setting the process chamber at a vacuum;

a process gas supply for supplying a process gas into the process chamber, the process gas being capable of providing different activated species along with a progress in its dissociation;

an electric field generator for generating an RF inductive electric field in the process chamber, the electric field being used for turning the process gas into plasma by means of RF discharge; and limiting means for limiting a mean free path of electrons in a skin-depth region of the plasma, the limiting means being capable of changing electron energy distribution in the skin-depth region of the plasma so as to optimize a dissociated state of the process gas relative to a certain process condition during the process.

According to a second aspect of the present invention, there is provided a plasma etching apparatus for subjecting a target object to an etching process, using plasma, comprising:

an airtight process chamber;

a work table arranged in the process chamber for supporting the target object;

an exhaust for exhausting and setting the process chamber at a vacuum;

a process gas supply for supplying a process gas including a reactive gas into the process chamber, the reactive gas being capable of providing different activated species along with a progress in its dissociation;

an electric field generator for generating an RF inductive electric field in the process chamber, the electric field being used for turning the process gas into plasma by means of RF discharge; and limiting means for limiting a mean free path of electrons in a skin-depth region of the plasma, the limiting means being capable of changing electron energy distribution in the skin-depth region of the plasma so as to optimize a dissociated state of the reactive gas relative to a certain process condition during the etching process.

In a plasma processing chamber according to the present invention, an RF inductive electric field generated in a process chamber by an electric field generator penetrates into a skin-depth region of plasma, and accelerates electrons in the skin-depth region. Limiting means for limiting a mean free path of electrons is arranged in the skin-depth region, such that the limiting means changes electron energy distribution in the skin-depth region so as to optimize a dissociated state of a process gas relative to a certain process condition during a plasma process. As a result, for example, in a plasma etching apparatus, a reactive gas is prevented from being excessively dissociated, so that an etching process can be performed with a high efficiency while keeping a high etching selectivity.

The limiting means may be formed of a plurality of barriers dispersedly arranged at intervals in a direction along which electrons in the skin-depth region dominantly move. Where the barriers are arranged to have a surface essentially perpendicular to the direction along which electrons dominantly move, electrons efficiently collide with the barriers so as to change the electron energy distribution with a high efficiency.

Where the electric field generator has an antenna of a solenoid coil arranged around the side wall of a process chamber, the barriers may be arranged to extend from the side wall of the process chamber into the skin-depth region. Where the electric field generator has an antenna of the planar type arranged on the ceiling of a process chamber, the barriers may be arranged to extend from the ceiling of the process chamber into the skin-depth region.

An electrostatic shield may be interposed between the antenna and the barriers. In this case, only an electric field perpendicular to the plasma surface is allowed to pass through, so that the inner wall of the process chamber is prevented from being sputtered. Baffle plates may be arranged at the distal ends of the barriers, respectively, so that the energy of high energy electrons present in areas, which are respectively defined by the barriers and the baffle plates, can be efficiently decreased. Where the barriers are made of a conductive material and supplied with a DC (direct current) potential, the potential difference between the barriers and plasma is suppressed, thereby decreasing sputtering degree of the barriers. Further, the barriers may be provided with temperature adjusting means and, e.g., heated, so that deposition on the barriers is suppressed. Where an inactive gas is introduced into the skin-depth region while a reactive gas is directly introduced into a region of plasma on the inner side of the skin-depth region, the reactive gas is further prevented from being excessively dissociated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

The present inventor has conducted researches in relation to problems, such as a decrease in etching selectivity and fluctuation in process performances, in a plasma etching apparatus of the inductively coupled type, such as TCP and ICP, and has found that excessive dissociation of a process gas is one of the reasons causing these problems.

Figure 17:
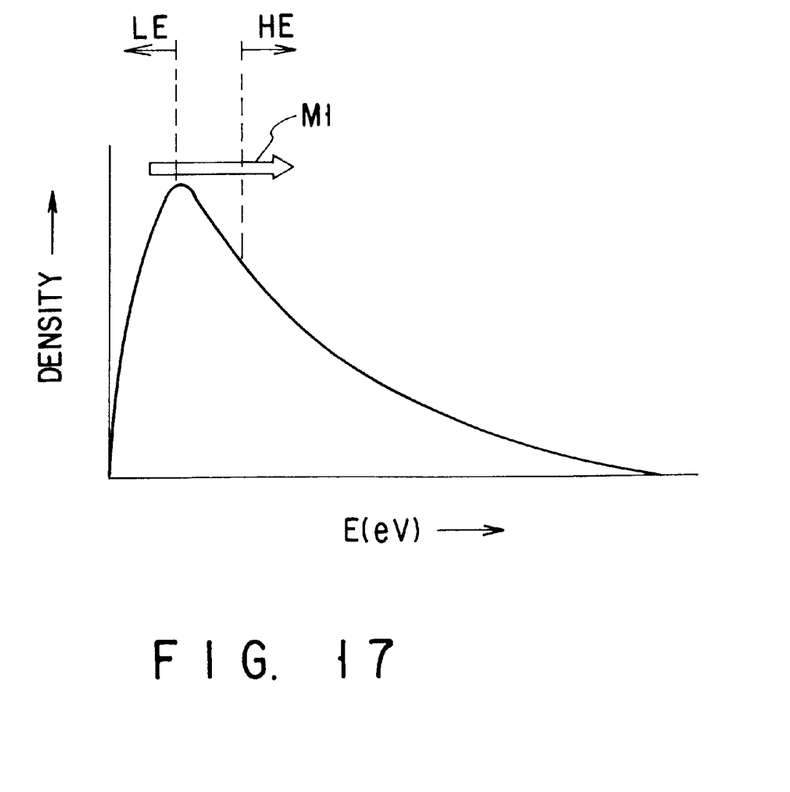
FIG. 17 is a view schematically showing the electron energy distribution of a high density plasma generated in a conventional plasma processing apparatus of the inductively coupled type.

FIG. 17 is a view schematically showing the electron energy distribution of a high density plasma generated in a conventional plasma processing apparatus of the inductively coupled type. It is thought that, in the energy distribution, the electrons of a low energy domain LE facilitate dissociation of a process gas, while electrons of a high energy domain HE facilitate ionization of the process gas. As shown in FIG. 17, this conventional plasma processing apparatus produces electrons of the low energy domain at a high density to form a high density plasma.

Figure 16:
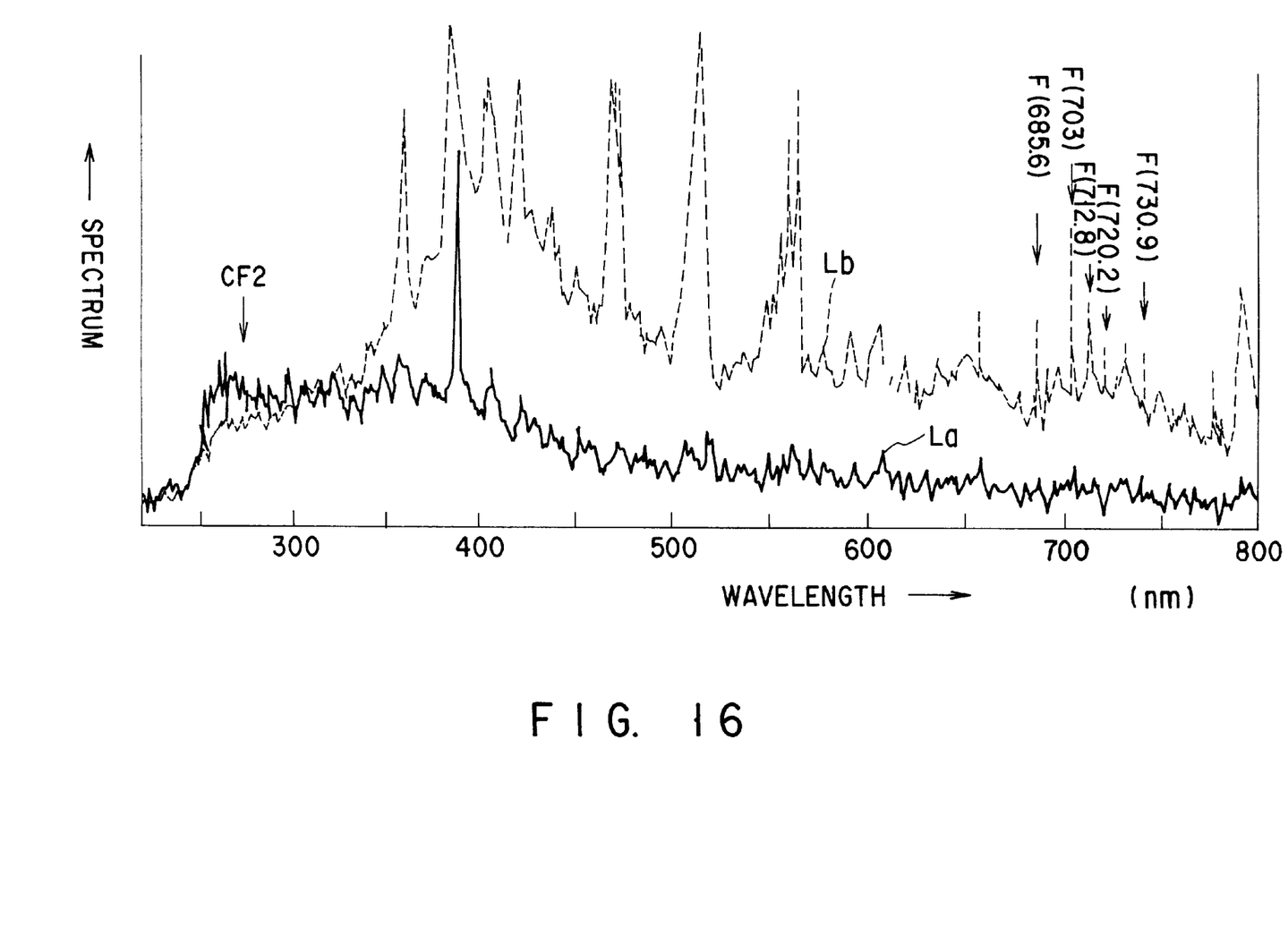
FIG. 16 is a graph showing dissociated states of a reactive gas in plasma processing apparatuses of the parallel plate type and of the inductively coupled type.

In the inductively coupled type, such as TCP and ICP, since an electric field oscillates in parallel to the wall of a process chamber, and electrons are moved back and forth without colliding with the wall of the process chamber. In this case, a skin depth is defined by a depth at which the electric field penetrates into plasma. For example, in a process chamber having a radius of 300 mm and set at a pressure of 5 mTorr and a plasma density of $5 \times 10^{11}/cm^3$, the thickness of the skin-depth region is about 17 mm. Electrons are efficiently accelerated in the skin-depth at a low energy. The accelerate electrons are diffused in the bulk plasma region present on the inner side of the skin-depth region.

Where low energy electrons, which correspond to an energy facilitating dissociation of a process gas, are produced in a large amount, dissociation of radicals proceeds in plasma excited by such electrons, at a rate higher than that in plasma generated by the parallel plate type. FIG. 16 is a graph showing data obtained by confirming this phenomenon with spectrum emitted from plasma. The data shown in FIG. 16 present comparison between plasma of the parallel plate type and plasma of the conventional inductively coupled type, where the same process chamber, vacuum degree, gas, gas flow rate, and plasma were used. In FIG. 16, characteristic lines La and Lb denote the parallel plate type and the conventional inductively coupled type, respectively. It is found that the inductively coupled type is lower in the light emission of $CF_2$ and higher in the light emission of F, and thus must provide further progress of gas dissociation, as compared to the parallel plate type.

For example, in a case where a silicon oxide film is etched by a CF-based gas, F radicals have an adsorption coefficient lower than those of CFx radicals. As a result, the F radicals are apt to remain in plasma so that the density of the F radicals increases in the plasma. It follows that the F/C ratio in a film, deposited on the surface of a semiconductor wafer or target object, increases up to about 1.8 from 0.8 of the parallel plate type. This causes an increase in the etching rate of a photoresist, thereby bringing about a decrease in etching selectivity of the silicon oxide film relative to the photoresist.

In order to avoid such a highly dissociated state, it has been proposed to recombine dissociated radicals and perform a plasma process, by separating a target object from a plasma generating source, or by turning on and off an RF (radio frequency) power for generating plasma with pulses having a width of several tens of micro seconds. However, in either case, plasma density is lowered near the target object to decrease the processing rate, thereby bringing about a difficulty in achieving the main purpose of utilizing a high density plasma.

Figure 1:
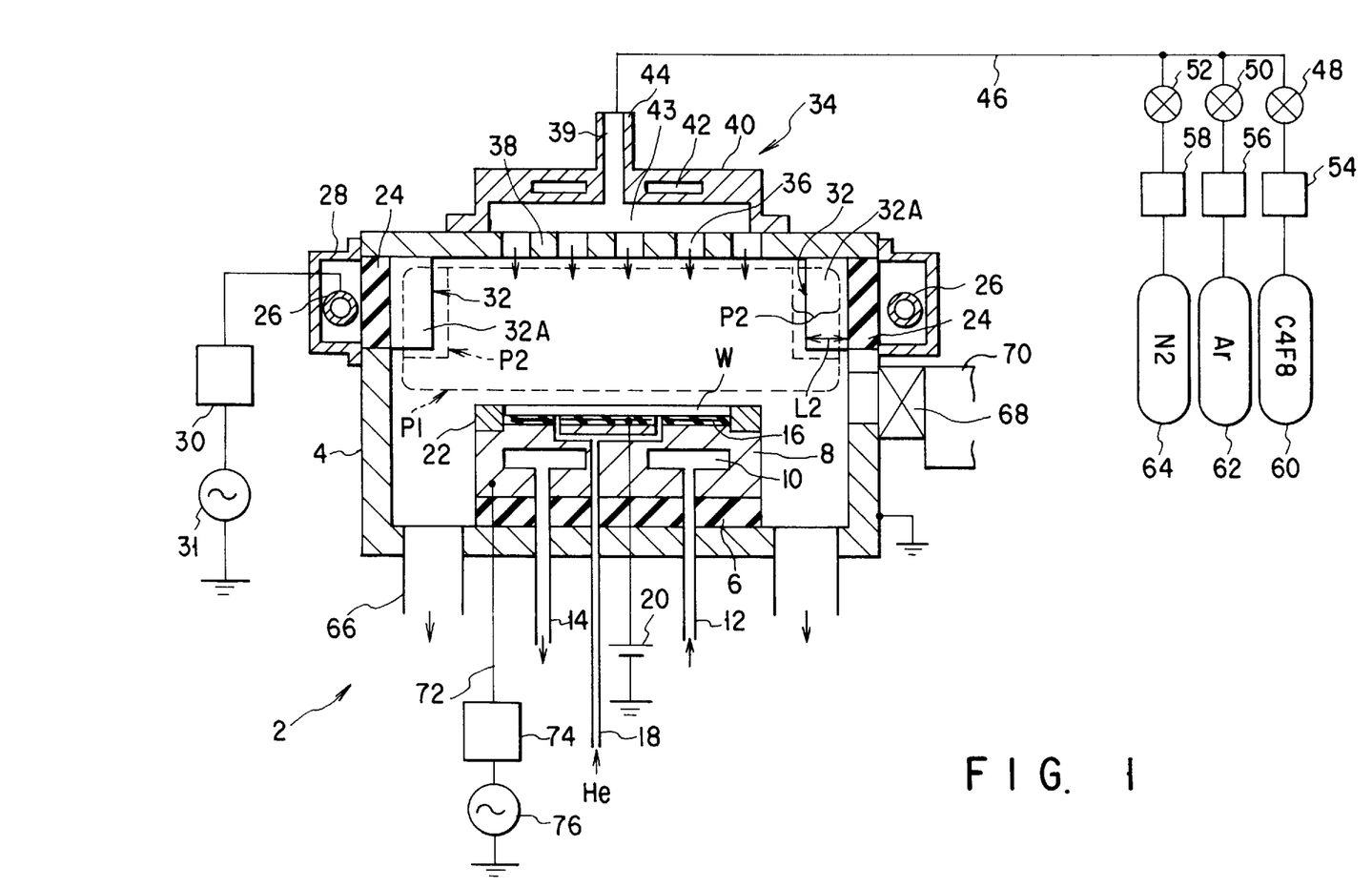
FIG. 1 is a structural view showing a plasma etching apparatus exemplifying a plasma processing apparatus according to an embodiment of the present invention.
Figure 2:
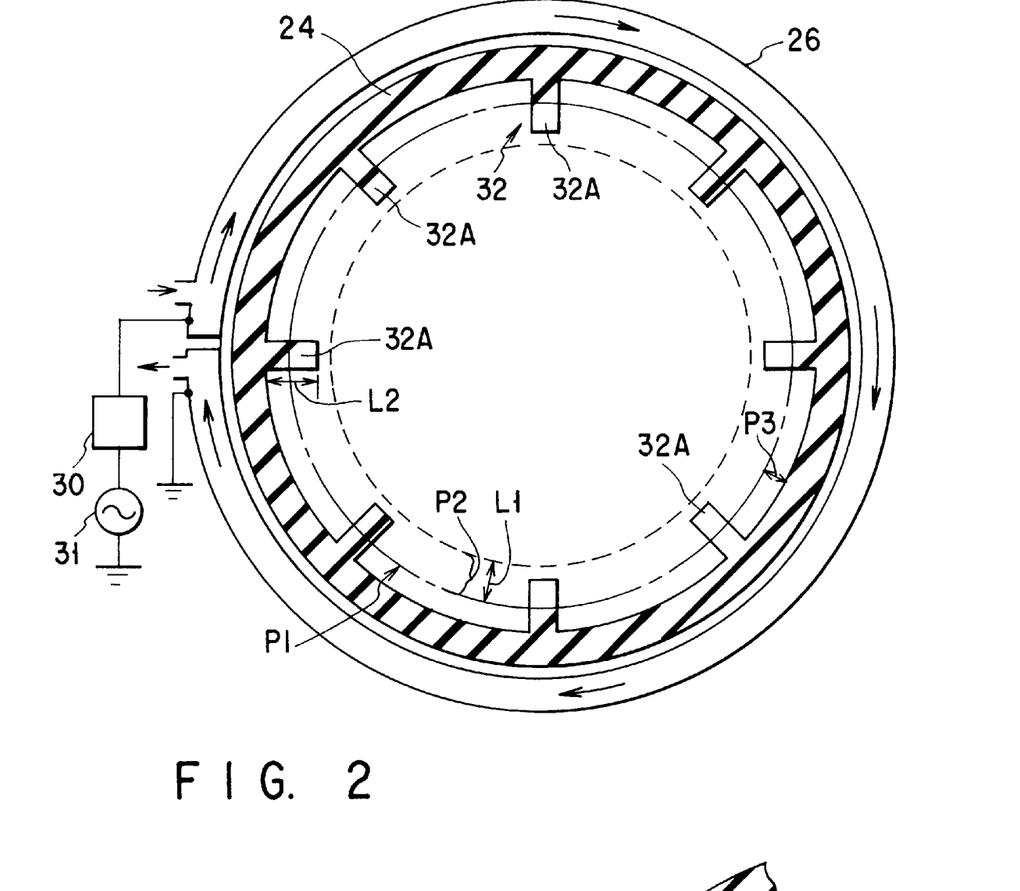
FIG. 2 is a cross-sectional plan view schematically showing the ceiling portion of the apparatus shown in FIG. 1.

FIG. 1 is a structural view showing a plasma etching apparatus 2 exemplifying a plasma processing apparatus according to an embodiment of the present invention. FIG. 2 is a cross-sectional plan view schematically showing the ceiling portion of the apparatus shown in FIG. 1.

The plasma etching apparatus 2 has an airtight process chamber 4 having a cylindrical shape and made of, e.g., aluminum, whose inner surface is anodized. The process chamber 4 defines an airtight process field and is grounded.

A susceptor 8 having a circular column shape is arranged via an insulating plate made of, e.g., ceramics, on the bottom of the process field formed in the process chamber 4, for mounting a target object, such as a semiconductor wafer W. The susceptor 8 is made of, e.g., aluminum covered with the anodized surface.

A coolant room 10 is formed in the susceptor 8. A coolant for temperature adjustment, such as liquid fluorocarbon, is introduced in the coolant room 10 through a coolant supply pipe 12, so that the coolant is circulated in the coolant room 10. The cold of the coolant is transmitted from the coolant room 10 to the wafer W through the susceptor 8 to cool the wafer W. The heat-exchanged coolant is exhausted to the outside of the process field through a coolant exhaustion pipe 14.

A gas passage 18 is formed in the insulating plate 6, the susceptor 8, and an electrostatic chuck 16 described later, for supplying a heat medium, such as He gas, to the backside of the wafer W to be processed. A heat transmission passage is ensured by the heat medium from the susceptor 8 to the wafer W, so that the wafer W is kept at a predetermined temperature by the coolant.

The central portion of the top of the susceptor 8 is formed to be a projection of a circular plate shape, on which the electrostatic chuck 16 having a diameter almost the same as that of the wafer W is disposed. The electrostatic chuck 16 has a conductive layer interposed between two polyimide films. When a DC (direct current) voltage, such as 1.5 kV, is applied to the conductive layer from a high DC power supply 20 located outside the process chamber 4, the wafer W placed on the electrostatic chuck 16 is attracted and held there by a Coulomb' force. Where the conductive layer is interposed between two layers of alumina ceramics, in place of the polyimide films, it is possible to prevent problems, such as malfunction of breakdown voltage, from being caused, and thereby to prolong its life.

A focus ring 22 is arranged around the top of the susceptor 8 so as to surround the wafer W placed on the electrostatic chuck 16. The focus ring 22 is made of an insulating material to shut out an electric field. Since no reactive ions are accelerated above the focus ring 22, the reactive ions generated by plasma are effectively radiated onto the wafer W inside the ring 22.

An RF wave transmitting window 24 made of an insulating material, such as quartz is arranged as the upper part of the side wall of the process chamber 4. RF inducing means, such as a ring-like antenna of, e.g., solenoidal coil 26, is arranged around the transmitting window 24. In this embodiment, although the coil 26 has only one turn, the number of turns may be two or more. An outer shield 28 made of a conductive material, such as aluminum, and grounded for preventing an RF wave from leaking outside is arranged to surround the solenoidal coil 26. One end of the solenoidal coil 26 is lead out through an insulating hole (not shown) to the outside of the shield 28, and connected to an RF power supply described later. The antenna, i.e., solenoidal coil 26 is formed of a tube in which cooling water is circulated for cooling. The solenoidal coil 26 is fixed to the outer shield 28 with insulating spacers (not shown) arranged at intervals.

Capacitors (not shown) may be dispersedly disposed between the coil 26 and the outer shield 28 to reduce its reactance. Instead, the inside of the outer shield 28 may be filled with a dielectric liquid (not shown) to dispersedly provide capacitors relative to the ground, thereby reducing the reactance of the coil 26. In this case, a coolant can be used as the dielectric liquid, so that the coil 26 is cooled.

An RF power supply 31, which outputs an RF power of, e.g., 13.56 MHz, is connected to the coil 26 through a matching circuit 30 including, e.g., a decoupling capacitor. An RF magnetic field for generating plasma is formed in the process chamber 4 by the coil through the RF wave transmitting window 24.

Limiting means 32, which is a characterizing part of the present invention, is arranged inside the RF wave transmitting window 24 for limiting a mean free path of electrons in a skin-depth region of plasma. Where the mean free path of electrons in the skin-depth region is shortened, the energy distribution of the electrons shown in FIG. 17 is changed such that the densities of high energy electrons and low energy electrons are decreased, while the density of middle energy electrons is increased. In other words, the density peak of the energy distribution is shifted toward the high energy side, as indicated with an arrow M1 in FIG. 17.

This phenomenon is thought to be caused such that the mean free path of electrons is limited by the limiting means 32, thereby decreasing the density of high energy electrons, while some amount of energy corresponding to the major part of the density decrease of the high energy electrons is transferred to low energy electrons and increases their energy, thereby decreasing the density of the low energy electrons as well. From another point of view, the phenomenon is thought to be caused such that the impedance of plasma including a skin-depth region is increased by the limiting means 32, the electric field is enhanced even under a constant power. Where electrons in the skin-depth region are accelerated by the electric field thus enhanced, the density peak of the energy distribution is shifted toward the high energy side.

Where the density of the low energy electrons is decreased, a process gas is prevented from being excessively dissociated. This is because the low energy electrons, which belong to the low energy domain LE shown in FIG. 17, facilitate dissociation of the process gas.

More specifically, the limiting means 32 is formed of a plurality of barriers 32A dispersedly arranged at regular intervals in an angular direction along the transmitting window 24. For example, where the wafer W has a diameter of 200 mm, i.e., 8-inch wafer, and the process chamber 4 has an inner diameter of 300 mm, the number of the barriers 32A is eight or more so as to set their intervals to be 120 mm or less, as shown in FIG. 2. The distal end of each barrier 32A extends toward the center of the process chamber 4 and into the skin-depth region P2 halfway. The barriers 32A each have a surface expanding essentially perpendicular to a direction in which electrons in the skin-depth region are dominantly moved.

In FIG. 2, the whole of the plasma region P1 is indicated with a one-dot chain line, while the skin-depth region P2 is a ring-like portion between the one-dot chain line and a broken line on its inner side. A region between the skin-depth region P2 and the inner wall of the process chamber 4 is called a plasma sheath region P3. The skin-depth region P2 has a thickness L1 of, e.g., 17 mm, into which the barriers 32A extend halfway, though the thickness depends on process conditions.

As described above, the skin-depth region is a region into which an RF electric field penetrates, while the RF electric field cannot enter the inner side of the plasma beyond the skin-depth region due to a skin effect. Accordingly, electrons present in the skin-depth region P2 are moved, at high speed, alternately clockwise and counterclockwise in a direction along the inner circumference of the process chamber 4. During this movement, high energy electrons collide with the barriers 32A dispersedly arranged perpendicular to the direction along the inner circumference in which the electrons dominantly moved. As a result, the density of the high energy electrons is decreased, and some amount of energy corresponding to the major part of the density decrease of the high energy electrons is transferred to low energy electrons and increases their energy, thereby decreasing the density of the low energy electrons as well. The barriers 32A have an extending length L2 of from 10 mm to 20 mm toward the skin-depth region P2, though the number of the barriers 32A and their extending length L2 may be selected in accordance with process conditions.

The barriers 32A may be made of a material the same as that of the RF wave transmitting window 24, such as quartz. In this case, the transmitting window 24 and the barriers are integrally formed such that projections each having the extending length L2 are arranged on the inner surface of the transmitting window 24.

An upper electrode 34 is arranged above the susceptor 8, and has a bottom surface facing the upper surface of the susceptor 8 in parallel, with a distance of from 20 mm to 40 mm therebetween. The upper electrode 34 has an electrode plate 38 defining the ceiling of the process chamber 4 and having a number of process gas spouting holes 36, and a head cover 40 arranged on the electrode plate 38. The electrode plate 38 is made of a conductive material, such as SiC or amorphous carbon, while the head cover 40 is made of a conductive material, such as aluminum covered with the anodized surface.

The head cover 40 is a container-like member having a recess therein and forms a diffusion room 43 in cooperation with the electrode plate 38. A process gas is uniformly supplied into the process chamber 4 through the diffusion room 43 and the spouting holes 36. In other words, the upper electrode 34 works as a shower head as well.

A coolant room 42 is formed in the head cover 40. A coolant for temperature adjustment, such as liquid fluorocarbon is introduced in the coolant room 42 through a coolant supply pipe (not shown), so that the coolant is circulated in the coolant room 42. The cold of the coolant is transmitted from the coolant room 42 to the electrode plate 38 to cool the electrode plate 38 down to a predetermined temperature. The heat-exchanged coolant is exhausted to the outside of the process field through a coolant exhaustion pipe (not shown). The electrode plate 38 is set at a temperature higher than that of the surface of the wafer W, such that radicals are directed to the wafer W and are not deposited on the surface of the electrode plate 38.

A gas supply port 39 is formed at the center of the head cover 40 of the upper electrode 34, and is connected to a gas supply pipe 44. The gas supply pipe 44 is divided into three lines through a line 46. The three lines communicate with process gas sources 60, 62 and 64 for storing respective process gases, through valves 48, 50 and 52 and mass-flow controllers 54, 56 and 58, respectively.

In this embodiment, $C_4F_8$ gas is supplied from the process gas source 60, Ar gas is supplied from the process gas source 62, and an inactive gas, such as $N_2$ gas, for a purging operation, is supplied from the process gas source 64.

An exhaustion pipe 66 communicating with vacuum exhausting means (not shown), such as a turbomolecular pump, is connected to a side wall of the process chamber 4. The process field in the process chamber 4 can be vacuum exhausted down to a predetermined decreased pressure by the exhausting means.

A load lock chamber 70 is connected to a side wall of the process chamber 4 through a gate valve 68, which can be hermetically opened and closed. The wafer W to be processed is transferred between the process chamber 4 and the load lock chamber 70 by transfer means (not shown), such as a transfer arm, arranged in the load lock chamber 70.

An electric feeder rod 72 is connected to the susceptor 8. An RF (radio frequency) power supply 76, which outputs an RF power of, e.g., 13.56 MHz, is connected to the electric feeder rod 72 through a matching circuit 74 including, e.g., a decoupling capacitor, so that a self bias can be applied to the susceptor 8 for attracting ions toward the susceptor 8.

Note that an RF power of, e.g., 13.56 MHz, may also be applied to the upper electrode 34, if necessary.

Although 13.56 MHz is used as the frequency of the above described RF powers, other frequencies may be used. For example, where ion bombardment of a relatively high energy is necessary as in etching a silicon oxide film, it is preferable in efficiency to supply the susceptor 8 with an RF power of less than several MHz, such as about 800 KHz, which ions can follow to move. On the other hand, where ion bombardment of a relatively low energy is necessary as in etching a polycrystalline silicon film, it is preferable to use an RF power of more that 10 MHz, and more preferably 13.56 MHz in light of industrial frequencies. In the latter case, since ions do not follow the RF wave, but are accelerated by a self bias potential, the ion bombardment is suppressed, thereby enabling the processing rate to be accurately controlled.

An RF power applied to the upper electrode 34 is generally utilized for the purpose of increasing plasma density. For this reason, it is preferable to use an RF power of a frequency of, e.g., from 10 MHz to 100 MHz, with which electrons are effectively accelerated.

An RF power applied to the solenoidal coil 26 is selected in light of other views, since the inductively coupled type presents a high efficiency of generating plasma. For example, the thickness of the skin-depth region depends on the frequency of an RF power applied to the solenoidal coil 26. Since the skin-depth region becomes large with a decrease in the frequency, it is preferable to use a relatively low frequency of, e.g., 2 MHz, so as to improve uniformity of plasma density.

The solenoidal coil 26, the susceptor 8, and the upper electrode 34 are supplied with RF powers from individual RF power supplies. Accordingly, the RF powers applied to the solenoidal coil 26, the susceptor 8, and the upper electrode 34 can be adjusted independently of each other.

An explanation will be given in relation to an operation of the plasma etching apparatus 2 having the above described structure. It will be assumed that a silicon oxide film on a wafer having a silicon substrate is to be etched, using the plasma etching apparatus 2.

At first, a wafer W to be processed is transferred by the transfer means from the load lock chamber 70 to the process chamber 4 and is mounted onto the electrostatic chuck 16, after the gate valve 68 is opened. The wafer W is attracted and held on the electrostatic chuck 16 by applying a power from the DC power supply 20. Then, the process chamber 4 is vacuum-exhausted by the exhausting means after the transfer means is retreated to the load lock chamber 70.

Meanwhile, the valve 48 is opened, so that $C_4F_8$ gas is supplied from the process gas source 60 while its flow rate is controlled by the mass-flow controller 54. Further, the valve 50 is opened, so that Ar gas is supplied from the process gas source 62 while its flow rate is controlled by the mass-flow controller 56. These gases are introduced into the upper electrode 34 through the gas line 46, gas supply pipe 44, and the gas inlet port 39. Further, the gases are uniformly spouted into the process chamber 4 through the spouting holes 36 formed on the electrode plate 38, as indicated with arrows in FIG. 1.

While the Ar gas and $C_4F_8$ gas are supplied, the process chamber 4 is exhausted, so that inside of the process chamber is kept at a predetermined pressure of, e.g., about 1 Pa.

Under such conditions, an RF power for generating plasma is applied to the solenoidal coil 26 and an RF power for self-bias is applied to the susceptor 8. By doing so, the gases are turned into plasma by an electric field generated between the susceptor 8 and the upper electrode 34, so that a layer of, e.g., $SiO_2$ on the wafer W is etched by the plasma.

With the RF power applied to the solenoidal coil 26, an RF inductive magnetic field is generated, so that an RF inductive electric field is generated to alternate in a direction along the inner circumference of the process chamber 4. Electrons in the skin-depth region P2, in which the electric field penetrates, are excited by the electric field to have a high energy. The electrons are moved back and forth in accordance with oscillation of the electric field, and collide with the process gases, thereby turning the gases into plasma.

Figure 3:
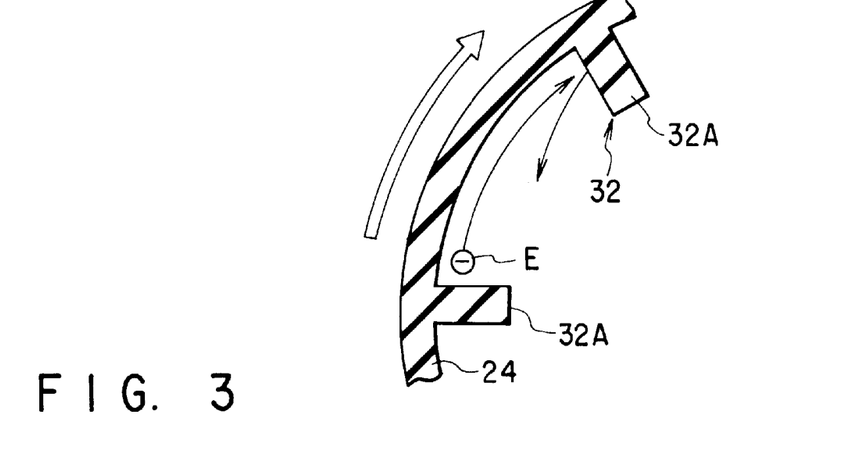
FIG. 3 is a manner of high energy electrons losing their energy.

As shown in FIGS. 2 and 3, the skin-depth region P2 having a ring shape is provided with the barriers 32A dispersedly arranged at regular intervals. As a result, high energy electrons E collide with the barriers at a high probability, so that they lose their energy. In FIG. 3, the direction of the RF inductive electric field at a moment is indicated with a white arrow. Although secondary electrons may be emitted, they lose their energy in the same manner.

The distance, with which electrons are moved by means of acceleration in a half cycle of the RF electric field, is increased with an increase in the intensity of the electric field, and decreased with an increase in the frequency of the electric field. The distance between the barriers 32A is optimized in accordance with those conditions.

With the barriers 32A, the density of high energy electrons is decreased, while some amount of energy corresponding to the major part of the density decrease of the high energy electrons is transferred to low energy electrons and increases their energy, thereby decreasing the density of the low energy electrons as well. Since the low energy electrons, which facilitate dissociation of a process gas, become low in their density, the process gas is prevented from being excessively dissociated. As a result, it is possible to perform a plasma process while keeping plasma at a high density. More specifically, in a process of etching the silicon oxide film, $C_4F_8$ gas is prevented from being excessively dissociated, so that F radicals and F ions are produced in a decreased amount, while intermediate products, such as $CF_2$ radicals and $CF_2$ ions, are produced in an increased amount (see FIG. 16). It follows that the F/C ratio in a film deposited on the wafer W is suppressed at about 0.8.

Further, since polymer deposition on the inner surface of the process chamber 4 becomes not influential, a stable process can be performed for a long period of time. The susceptor 8 is supplied with a self-bias power, so that a voltage is applied to the plasma sheath, in which ions are accelerated toward the wafer W.

As described above, according to this embodiment, a high density plasma which has not been excessively dissociated is obtained, while ion radiation energy relative to the wafer is controlled independently of the plasma density. By doing so, a condition range for performing a stable process becomes wider than that in a conventional apparatus, so that process conditions which concurrently satisfy a plurality of requirements, such as a process rate, an etching selectivity relative to a photoresist, an etched shape, and reproductivity.

Figure 4:
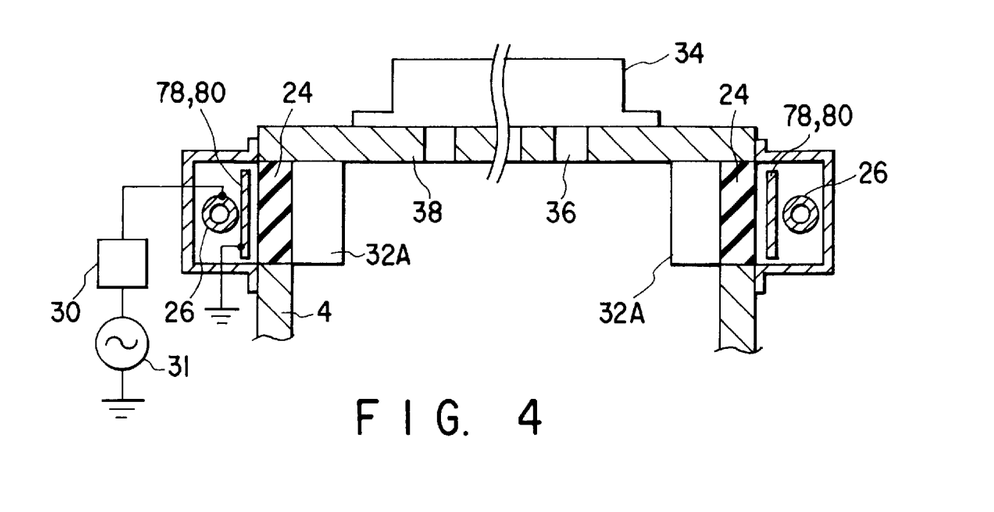
FIG. 4 is a partial structural view showing a modification in which the apparatus shown in FIG. 1 is provided with an electrostatic shield.
Figure 5:
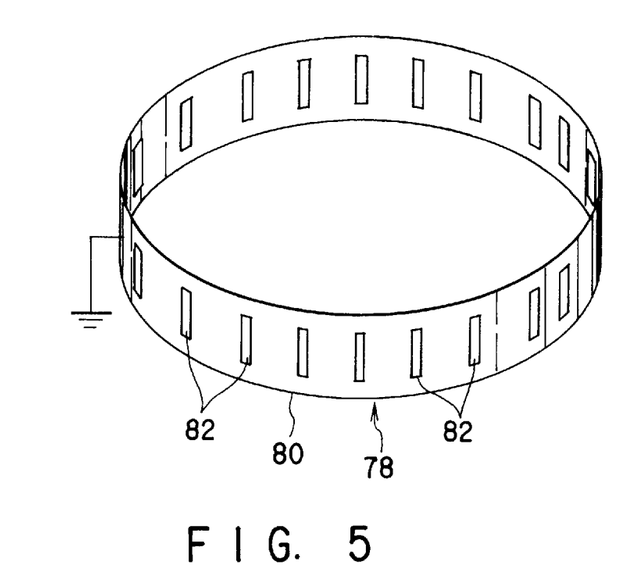
FIG. 5 is a perspective view of the electrostatic shield shown in FIG. 4.

As shown in FIG. 4, an electrostatic shield 78 may be disposed between the solenoidal coil 26 and the RF wave transmitting window 24, though nothing is arranged there in the above described embodiment. FIG. 5 is a perspective view showing the electrostatic shield 78 formed of, e.g., a conductive ring plate 80 which is made of copper and has a number of slits 82 arranged at regular intervals in an angular direction. The shield 78 is grounded and disposed between the coil 26 and the window 24.

The shield 78 shields an electric field parallel to the surface of plasma and allows an electric field perpendicular to the surface of the plasma to pass through. As a result, it is possible to prevent the plasma sheath from bearing a voltage in an undesirable direction, thereby preventing the inner surface of the RF wave transmitting window 24 from being sputtered by plasma. The width and intervals of the slits 82 are determined on the basis of, e.g., the frequency of an RF power applied to the coil 26. Where the RF power has a frequency of 13.56 MHz as in this embodiment, the width and each interval are set at 2 mm and 20 mm, respectively.

Figure 6:
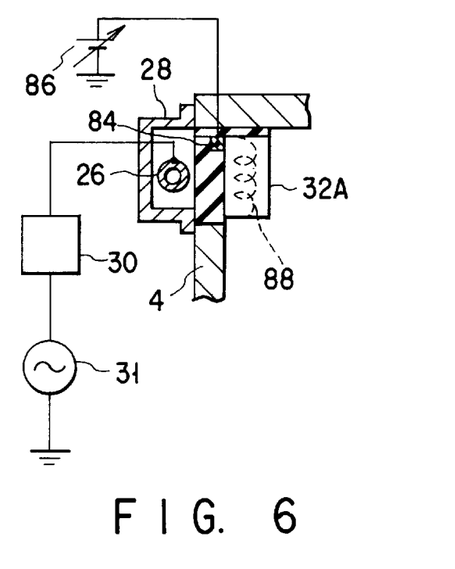
FIG. 6 is a partial structural view showing a manner of mounting barriers, which are made of conductive material.
Figure 7:
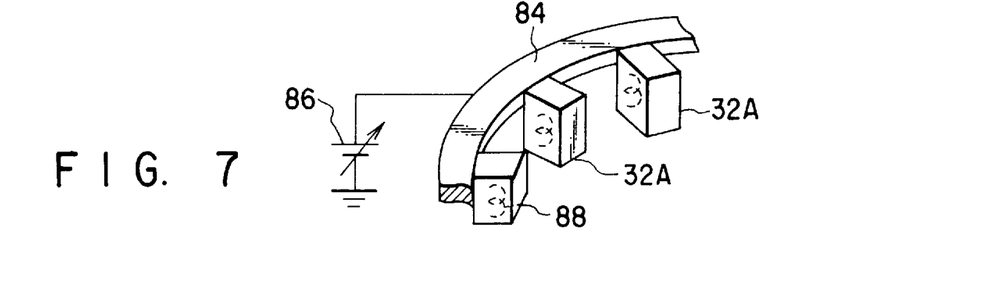
FIG. 7 is a perspective view of the barriers shown in FIG. 6.

Further, in this embodiment, the barriers 32A made of an insulating material, such as quartz, are used as the limiting means extending into the skin-depth region. Instead, the barriers 32A may be made of a conductive material, such as copper or aluminum covered with the anodized surface. In this case, as shown in FIGS. 6 and 7, the barriers 32A are connected to each other at their outer sides by a conductive connecting ring 84, which is sandwiched and fixed between the side wall and the ceiling of the process chamber 4, though another manner of fixing the ring 84 may be used. An electric potential of positive or negative is adjustably applied to the barriers 32A from a DC (direct current) power supply 86 so as to control the potential difference between the barriers 32A and plasma. By doing so, it is possible to prevent the barriers 32A from being sputtered, thereby preventing particles from being generated from a deposited film and preventing the barriers 32A from wearing down.

The barriers 32A may be provided with temperature adjusting means 88, such as a ceramic heater or heating resistor, embedded therein. In this case, the barriers 32A are heated at a temperature of, e.g., from 150° C. to 200° C., with which no deposition is caused on the barriers 32A, though the temperature depends on process conditions. By doing so, a thin film, which is apt to discharge a dissociated gas during a plasma process, is prevented from being deposited on the barriers 32A, so that reproductivity of the process is improved and particle generation is suppressed.

Figure 8:
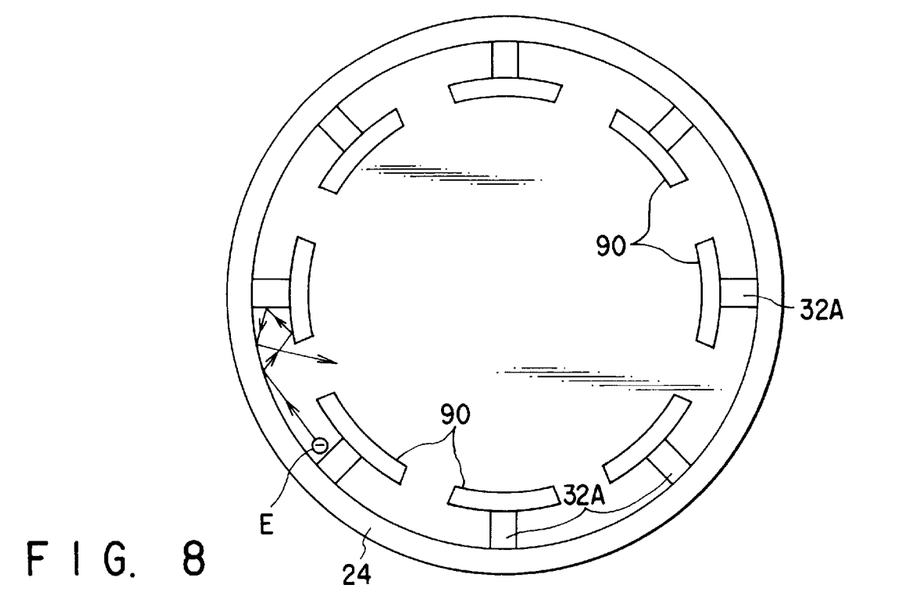
FIG. 8 is a plan view showing barriers, which are provided with baffle plates at their distal ends.

As shown in FIG. 8, baffle plates 90 may be respectively connected to the distal ends of barriers 32A, so as to control the amount of electrons moved toward the center of the process chamber 4, i.e., the center of plasma. The baffle plates 90 each have a surface expanding essentially parallel to a direction in which electrons in the skin-depth region are dominantly moved. Spaces are respectively formed in the areas defined by the baffle plates 90, the barriers 32A and the transmitting window 24, for suppressing electrons leaking therefrom. In this case, electrons accelerated by the electric field collide with the barriers 32A and the baffle plates 90 at a high probability. As a result, the electron energy distribution in the process chamber 4 is effectively changed, so as to efficiently prevent a process gas from being excessively dissociated.

Figure 9:
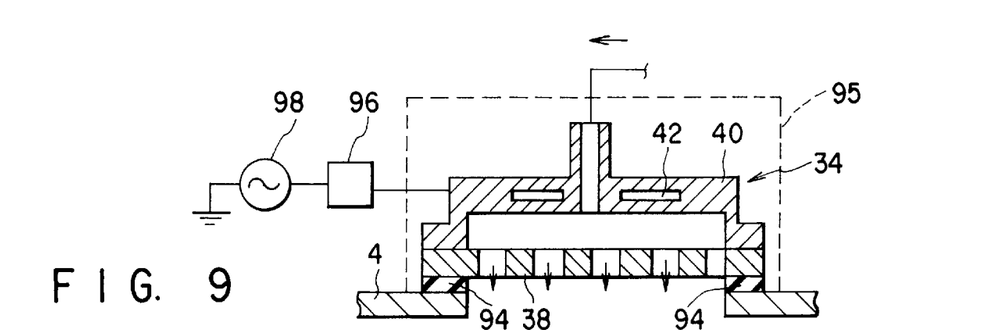
FIG. 9 is a structural view showing an upper electrode, which is supplied with an RF power.

In the above described embodiment, upper electrode 34 is mounted on and electrically communicates with the ceiling of the process chamber 4. Instead, an insulating body 94 (see FIG. 9) may be interposed between the upper electrode 34 and the ceiling of the process chamber 4. In this case, as shown in FIG. 9 an RF power supply 98, which outputs an RF power of, e.g., 13.56 MHz, is connected to the upper electrode 34 through a matching circuit 96, so that an RF power is applied to the upper electrode 34. Note that a broken line 95 indicates a shield for preventing an RF wave from leaking.

According to the structure shown in FIG. 9, an RF power is independently applied to the upper electrode 34. With this arrangement, it is possible to combine an RF inductively coupled plasma with a capacitively coupled plasma of the parallel plate type so as to generate plasma having intermediate characteristics therebetween.

Figure 10A:
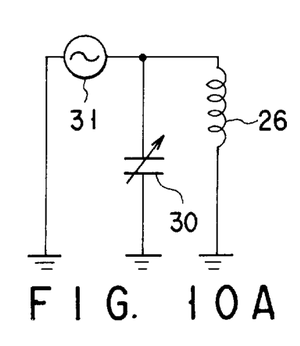
FIGS. 10A to 10C are views each showing a circuit structure of RF inducing means.
Figure 10B:
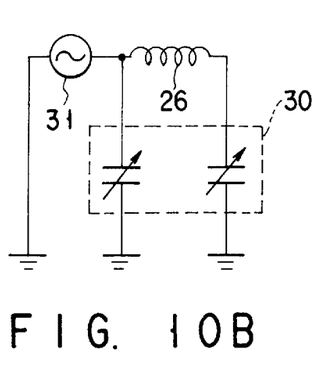
Figure 10C:
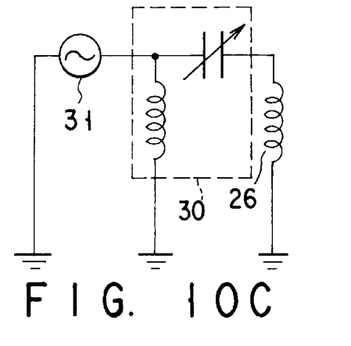

As shown in FIGS. 10A to 10C, various kinds of systems may be adopted for connecting the solenoidal coil 26, the matching circuit 30 and the RF power supply 31.

In the above described embodiment, an antenna formed of the solenoidal coil 26 arrange around the side wall of the process chamber 4 is used as RF inducing means. Instead, a planar antenna arranged on the ceiling of the process chamber 4 may be used as the RF inducing means. An apparatus having such an antenna will be explained next.

Figure 11:
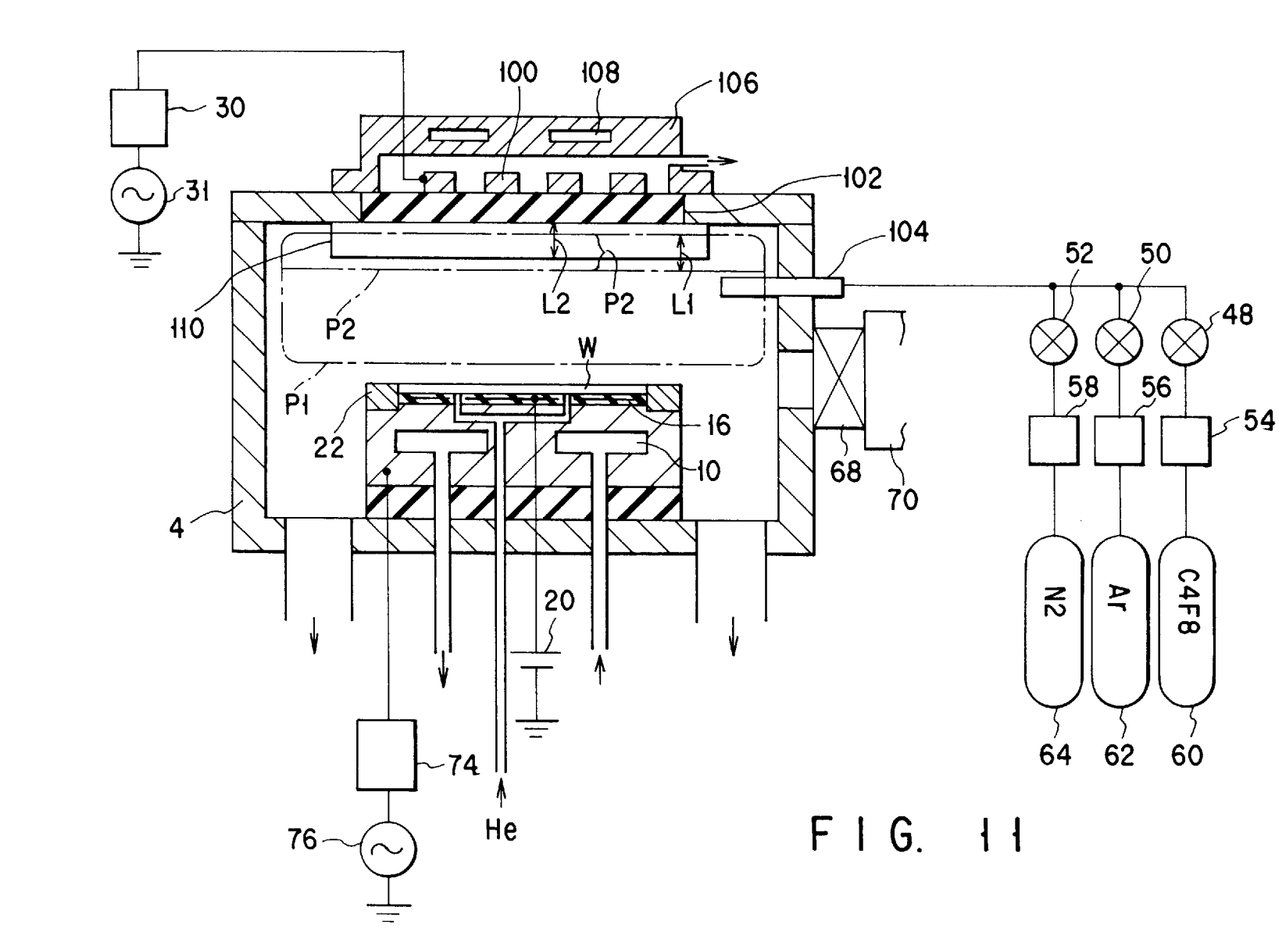
FIG. 11 is a structural view showing a plasma etching apparatus, which employs an antenna of the planar type for the RF inducing means, according to another embodiment of the present invention.
Figure 12:
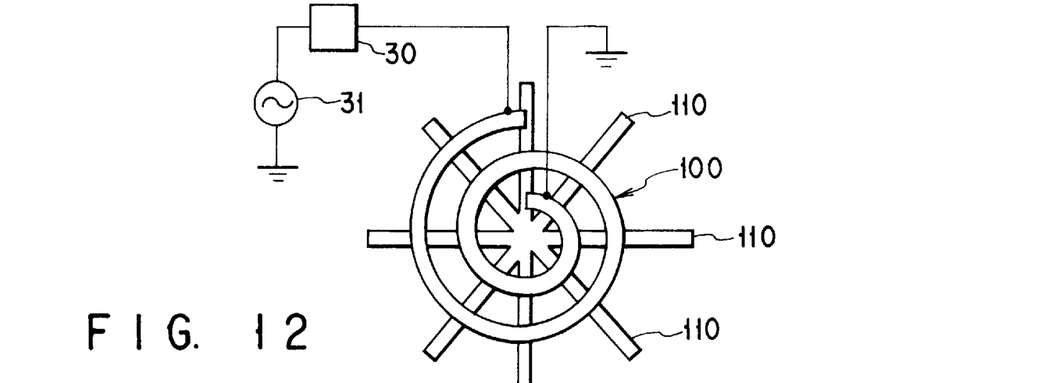
FIG. 12 is a structural plan view showing the relationship between the antenna and barriers of the apparatus shown in FIG. 11.

FIG. 11 is a structural view showing a plasma etching apparatus, which employs an antenna of the planar type for the RF inducing means, according to another embodiment of the present invention. FIG. 12 is a structural plan view showing the relationship between the antenna and barriers of the apparatus. Note that the members of this embodiment, which are the same as those in the former embodiment, are provided with the same reference numbers and their detail explanation will be omitted.

In this embodiment, which employs a planar antenna 100 having a shape of concentric circles or a spiral, an RF wave transmitting window 102 made of dielectric material, such as quartz, is hermetically arranged in the ceiling of a process chamber 4 to correspond to the antenna 100. In this case, gas supply means, such as a gas supply nozzle 104, for supplying a predetermined gas into the process chamber 4, is connected to the side wall of the process chamber 4 to escape an RF electric field.

The entirety of the antenna 100 is hermetically covered with a cover 106 made of a conductive material, such as aluminum, and grounded. Where the transmitting window 102 is too large to bear the atmospheric pressure, the inside of the cover 106 is vacuum exhausted so as to reduce tensile stress and sharing stress to be loaded on the transmitting window 102. A coolant room 108 is formed in the cover 106 so as to cool the cover 106 by a coolant flowing in the coolant room 108.

One end of the antenna 100 is lead out through an insulating hole (not shown) to the outside of the cover 106, and connected to an RF power supply system, while the other end is grounded. Note that this other end may be opened. The RF power supply system may be formed of any one of various systems, as shown in FIGS. 10A to 10C.

The antenna 100 may be tubular so as to allow cooling water to be circulated in it. The antenna is fixed to the cover 106 by insulating spacers (not shown) arranged at intervals.

Capacitors (not shown) may be dispersedly disposed between the antenna 100 and the cover 106 to reduce its reactance. By doing so, it is possible to suppress electric discharge generated due to a local increase in voltage. Instead, the inside of the cover 106 may be filled with a dielectric liquid (not shown) to dispersedly provide capacitors relative to the ground, thereby reducing the reactance of the antenna 100. In this case, a coolant can be used as the dielectric liquid, so that the antenna 100 is cooled.

An electrostatic shield (not shown) may be disposed between the antenna 100 and the RF wave transmitting window 102. The electrostatic shield is made of copper, has a number of slits and is grounded. The shield shields an electric field parallel to the surface of plasma and allows an electric field perpendicular to the surface of the plasma to pass through. As a result, it is possible to prevent the plasma sheath from bearing a voltage in an undesirable direction, thereby preventing the inner surface of the RF wave transmitting window 102 from being sputtered by plasma. This is the same as in the former embodiment.

A plurality of barriers 110 are arranged under the transmitting window 102 to extend downward, and used as limiting means for limiting a mean free path of electrons in the skin-depth region of plasma. The barriers 110 are made of an insulating material, such as quartz, and are arranged to extend in radial directions. Since an RF inductive electric field generated in an angular direction by the spiral antenna 100, the barriers 110 are arranged in radial directions to be perpendicular to the direction of the electric field. The projecting length L2 of the barriers 110 is set to be from 10 mm to 20 mm, though it depends on process conditions.

When an RF power is applied to the spiral and planar antenna 110, an RF electric field is generated along the inner circumference of the process chamber 4. Electrons accelerated by the electric filed collide with the barriers 110, which are arranged in radial directions, i.e., to be perpendicular to the dominant direction of movement of the electrons. As a result, energy distribution of the electrons is changed as described above, and a process gas is prevented from being excessively dissociated. It follows that a high density plasma, which has not been excessively dissociated, is obtained as in the former embodiment, so that process conditions which concurrently satisfy a plurality of requirements, such as a process rate, an etching selectivity relative to a photoresist, an etched shape, and reproductivity.

Figure 13:
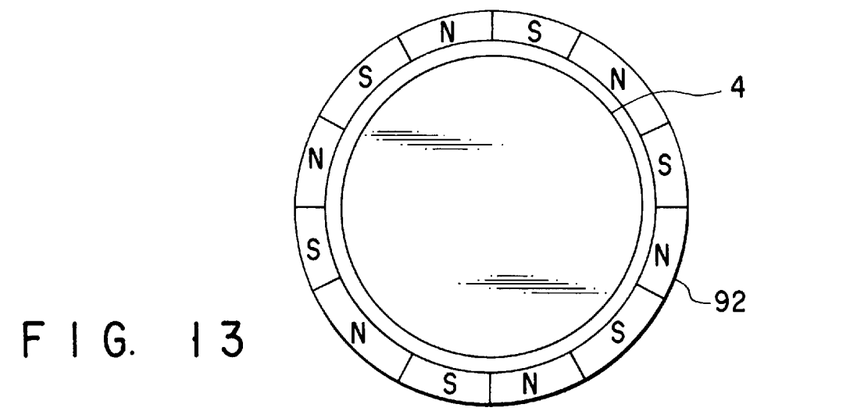
FIG. 13 is a structural view showing a multi-pole magnet.

As shown in FIG. 13, a multi-pole magnet 92 having a ring shape, in which N poles and S poles of magnets are alternately arranged, may be arranged around the process chamber 4. The multi-pole magnet 92 facilitates confinement of plasma, so that the inner wall of the process chamber 4 is protected from plasma bombardment while charged particles are prevented from vanishing on the inner wall of the process chamber 4, thereby further increasing plasma density.

Figure 14:
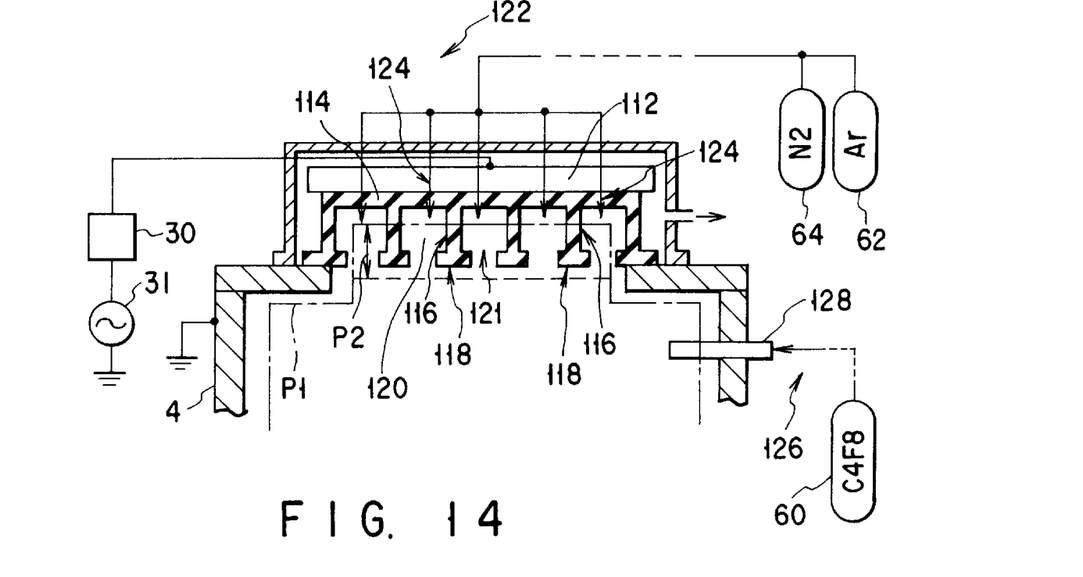
FIG. 14 is a structural view showing a plasma etching apparatus, which employs an antenna of a radial pattern shape for the inducing means, according to still another embodiment of the present invention.
Figure 15:
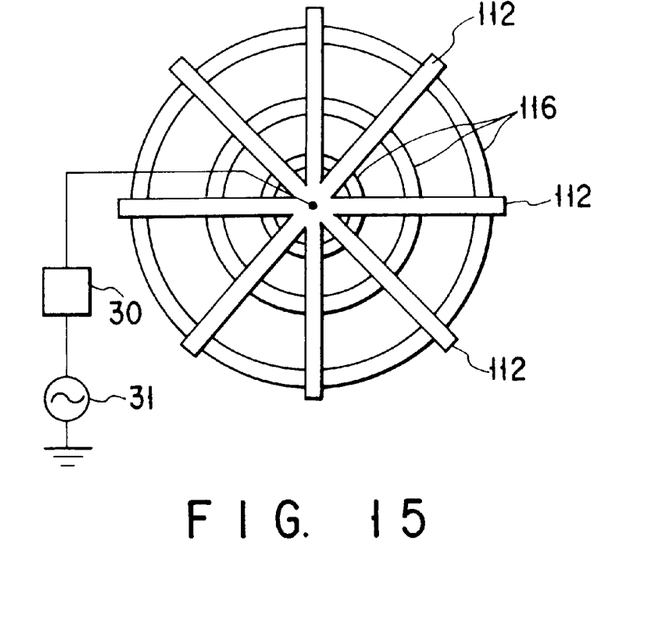
FIG. 15 is a structural plan view showing the relationship between the antenna and barriers of the apparatus shown in FIG. 14.

In place of the spiral and planar antenna 100 used in the embodiment shown in FIGS. 11 and 12, a radial or asterisk antenna 112 may be used as shown in FIGS. 14 and 15.

In the embodiment shown in FIGS. 14 and 15, the radial antenna 112 is arranged on an RF wave transmitting window 114. A plurality of barriers 116 are arranged in a concentric fashion to extend essentially perpendicular to the antenna 112. Baffle plates 118 each having a ring shape are respectively arranged at the bottom end of barriers 116, such that an opening is formed between two adjacent baffle plates 118. The RF wave transmitting window 114, the barriers 116 and the baffle plates 118 are integrally made of, e.g., an insulating material. The areas defined by these members constitutes ring spaces 120. As in the former embodiments, the barriers 116 extend into a skin-depth region P2 halfway.

In this embodiment, inactive gas supply means 122 for supplying an inactive gas, such as Ar gas, which is not to be dissociated, has inactive gas nozzles 124 respectively arranged in the spaces 120. On the other hand, reactive gas supply means 126 for supplying a reactive gas, such as $C_4F_8$, which is to be dissociated, has a reactive gas nozzle 128 arranged to directly supply the reactive gas into a plasma region under the skin-depth region P2.

When an RF power is applied to the antenna 112, an RF electric field is generated to oscillate in radial directions of the process chamber 4, so that electrons in the skin-depth region P2 are moved back and forth in radial directions of the process chamber 4. Electrons accelerated and moved by the electric field collide with the barriers 116, which are coaxially arranged in the skin-depth region P2, i.e., to be essentially perpendicular to the dominant direction of movement of the electrons. As a result, energy distribution of the electrons is changed as described above.

Further, the barriers 116 are provided with baffle plates 118 to form the spaces 120. High energy electrons collide with the inner wall of the spaces 120 at a high rate, so that the energy distribution is efficiently changed, and electrons having a decreased energy are discharged as the main part from the opening 121. As a result, the reactive gas is prevented from excessively dissociated, as in the former embodiments. Particularly, in this embodiment, only the inactive gas, which is not to be dissociated, is supplied in the skin-depth region P2 in the spaces 120, thereby further suppressing dissociation of the reactive gas. In other words, excessive dissociation of the reactive gas is effectively suppressed, so as to increase etching selectivity. Note that the spaces 120 may be cooled or heated, if necessary.

In the above described embodiments, a silicon oxide film ($SiO_2$) is etched, using a gas in which Ar gas is added to $C_4F_8$ gas. However, the present invention is not limited to such etching, but may be applied to, e.g., etching of a silicon nitride film.

As a process gas, it is possible to use one or more of non-compound or compound gases which are formed of an element or elements selected from a group consisting of carbon (C), fluorine (F), hydrogen (H), and oxygen (O), and are selected such that all the elements listed up in the above described group are supplied in the process chamber. For example, a CF-based gas, such as $CH_4$, $CHF_3$, $CH_2F_2$, $CH_3F$, $C_2F_6$, $C_2H_2F_2$, $C_3F_3$, or $C_4F_8$ is used as the main gas component, while $H_2$, CO, $O_2$, $CH_4$, $C_2H_4$, Ar, He, Xe, or Kr is used as an added gas component.

Further, a plasma processing apparatus according to the present invention may be applied to a CVD, ashing, or sputtering apparatus other than an etching apparatus. As a target object to be processed other than a semiconductor wafer, an LCD substrate or the like is included.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus for subjecting a target object to a process, using plasma, comprising:

an airtight process chamber;

a work table arranged in said process chamber for supporting said target object;

an exhaust for exhausting and setting said process chamber in a vacuum condition;

a process gas supply for supplying a process gas into said process chamber, said process gas being capable of providing different activated species along with a progress in its dissociation;

an electric field generator including an RF power supply and an antenna receiving RF power from said RF power supply, said electric field generator generating an RF inductive electric field in said process chamber, said inductive electric field turning said process gas into plasma by means of RF discharge; and limiting means for limiting a mean free path of electrons in a skin-depth region of said plasma, said limiting means changing electron energy distribution in said skin-depth region of said plasma so as to optimize a dissociated state of said process gas relative to a certain process condition during said process.

2. The apparatus according to claim 1, wherein said limiting means decreases density of low energy electrons in said skin depth region so as to suppress progress of dissociation of said process gas.

3. The apparatus according to claim 1, wherein said limiting means comprises barriers arranged such that electrons in said skin depth region collide with said barriers.

4. The apparatus according to claim 3, wherein said barriers each have a surface expanding perpendicular to a direction in which electrons in said skin-depth region are dominantly moved.

5. The apparatus according to claim 4, wherein said antenna comprises a solenoidal coil antenna arranged around a side wall of said process chamber, and said barriers are arranged to extend into said skin-depth region from said side wall.

6. The apparatus according to claim 4, wherein said antenna comprises a planar antenna arranged on a ceiling of said process chamber, and said barriers are arranged to extend into said skin-depth region from said ceiling.

7. The apparatus according to claim 4, comprising an electrostatic shield arranged between said antenna and said barriers.

8. The apparatus according to claim 4, further comprising baffle plates arranged on distal ends of said barriers for reducing electrons moved toward a center of the plasma.

9. The apparatus according to claim 8, wherein said baffle plates each have a surface expanding parallel to said direction in which electrons in said skin-depth region are dominantly moved.

10. The apparatus according to claim 3, wherein said barriers are made of an insulating material.

11. The apparatus according to claim 3, wherein said barriers are made of a conductive material and are supplied with an electric potential from a DC power supply.

12. The apparatus according to claim 3, further comprising temperature adjusting means for adjusting temperature of said barriers.

13. The apparatus according to claim 1, wherein said process gas comprises an inactive gas and a reactive gas and said process gas supply comprises means for supplying said inactive gas into said skin-depth region, and means for supplying said reactive gas directly into a region in said plasma other than said skin-depth region.

14. A plasma etching apparatus for subjecting a target object to an etching process, using plasma, comprising:

an airtight process chamber;

a work table arranged in said process chamber for supporting said target object;

an exhaust for exhausting and setting said process chamber in a vacuum condition;

a process gas supply for supplying a process gas including a reactive gas into said process chamber, said reactive gas being capable of providing different activated species along with a progress in its dissociation;

an electric field generator including an RF power supply and an antenna receiving RF power from said RF power supply, said electric field generator generating an RF inductive electric field in said process chamber, said inductive electric field turning said process gas into plasma by means of RF discharge; and limiting means for limiting a mean free path of electrons in a skin-depth region of said plasma, said limiting means changing electron energy distribution in said skin-depth region of said plasma so as to optimize a dissociated state of said reactive gas relative to a certain process condition during said etching process.

15. The apparatus according to claim 14, wherein said limiting means decreases density of low energy electrons in said skin depth region so as to suppress progress of dissociation of said reactive gas.

16. The apparatus according to claim 15, wherein said limiting means comprises barriers arranged such that electrons in said skin depth region collide with said barriers.

17. The apparatus according to claim 16, wherein said barriers each have a surface expanding perpendicular to a direction in which electrons in said skin-depth region are dominantly moved.

18. The apparatus according to claim 14, wherein said process gas further comprises an inactive gas and said process gas supply comprises, means for supplying said inactive gas into said skin-depth region, and means for supplying said reactive gas directly into a region in said plasma other than said skin-depth region.

* * * * *